(12) United States Patent
Yuan et al.

(10) Patent No.: US 12,177,169 B2
(45) Date of Patent: Dec. 24, 2024

(54) SELF-INTERFERENCE CANCELLATION IN FREQUENCY DIVISION DUPLEXING SYSTEM

(71) Applicant: Samsung Electronics Co., Ltd., Suwon-si (KR)

(72) Inventors: Jin Yuan, Richardson, TX (US); Khurram Muhammad, Southlake, TX (US); Gary Xu, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 477 days.

(21) Appl. No.: 17/142,116

(22) Filed: Jan. 5, 2021

(65) Prior Publication Data

US 2022/0029774 A1 Jan. 27, 2022

Related U.S. Application Data

(60) Provisional application No. 63/057,118, filed on Jul. 27, 2020.

(51) Int. Cl.
*H04L 5/14* (2006.01)
*H03M 1/12* (2006.01)
(Continued)

(52) U.S. Cl.
CPC ............ *H04L 5/1461* (2013.01); *H04B 1/44* (2013.01); *H04L 25/03012* (2013.01); *H03M 1/12* (2013.01)

(58) Field of Classification Search
CPC .................................................. H04L 5/1461
See application file for complete search history.

(56) References Cited

U.S. PATENT DOCUMENTS

2008/0089397 A1* 4/2008 Vetter .................... H04B 1/525
   375/220
2008/0144539 A1* 6/2008 Sperlich ................ H04L 27/368
   370/278

(Continued)

FOREIGN PATENT DOCUMENTS

CN        101420246 A       4/2009
WO     2015080769 A1       6/2015
WO   WO-2019005285 A1 *   1/2019   ....... H04L 25/03057

OTHER PUBLICATIONS

CTS Corporation; "Duplexers", Jan. 2017, 6 pgs. https://www.ctscorp.com/wp-content/uploads/2017.01.17-Duplexers.pdf.

(Continued)

*Primary Examiner* — Abdeltif Ajid

(57) ABSTRACT

A method and an apparatus for self-interference cancellation in a communication device. The communication device includes an antenna configured to transmit a transmit signal and receive a receive signal through a duplexer in FDD communications, a first analog to digital converter (ADC) configured to convert the receive signal from analog to digital, a coupler configured to couple a sample of the transmit signal to a second ADC, which is configured to convert the sample of the transmit signal from analog to digital, and self-interference cancellation circuitry configured to process the digital sample of the transmit signal to generate a self-interference cancellation signal and apply the self-interference cancellation signal to the digital receive signal to cancel an amount of interference induced in the receive signal by the transmit signal. The SIC process provides additional isolation between TX signal and RX signal. The additional isolation could be utilized to relief the isolation requirement for the duplexer, reducing the cost and form factor of the duplexer.

14 Claims, 11 Drawing Sheets
(1 of 11 Drawing Sheet(s) Filed in Color)

(51) Int. Cl.
H04B 1/44 (2006.01)
H04L 25/03 (2006.01)

(56) References Cited

U.S. PATENT DOCUMENTS

| | | | |
|---|---|---|---|
| 2009/0318133 A1* | 12/2009 | Azuma | H03G 3/3052 |
| | | | 455/226.1 |
| 2011/0228828 A1 | 9/2011 | Wang et al. | |
| 2014/0161005 A1 | 6/2014 | Laurent-Michel | |
| 2015/0236748 A1 | 8/2015 | Nobbe | |
| 2015/0263782 A1 | 9/2015 | Wyville et al. | |
| 2016/0020859 A1 | 1/2016 | Laurent-Michel | |
| 2016/0105213 A1 | 4/2016 | Hua et al. | |
| 2016/0211927 A1 | 7/2016 | Mo et al. | |
| 2016/0308562 A1 | 10/2016 | Wyville et al. | |
| 2018/0131502 A1 | 5/2018 | Askar et al. | |
| 2019/0013923 A1 | 1/2019 | Liu et al. | |
| 2019/0123940 A1* | 4/2019 | Moorti | H04L 27/2651 |
| 2020/0235902 A1* | 7/2020 | Montalvo | H04B 1/0057 |
| 2023/0012971 A1* | 1/2023 | Ito | A61B 5/02125 |

OTHER PUBLICATIONS

Hong, et al., "Applications of Self-Interference Cancellation in 5G and Beyond", 5G Wireless Communication Systems: Prospects and Challenges, IEEE Communications Magazine, Feb. 2014, 8 pgs.
International Search Report and Written Opinion of the International Searching Authority dated Jul. 26, 2021 in connection with International Application No. PCT/KR2021/004892, 8 pages.
Extended European Search Report issued Jul. 12, 2023 regarding Application No. 21849972.1, 8 pages.
Chinese National Intellectual Property Administration, Office Action issued Aug. 31, 2024 regarding Application No. 202180060346.9, 12 pages.

* cited by examiner

SELF-INTERFERENCE CANCELLATION IN FREQUENCY DIVISION DUPLEXING SYSTEM

CROSS-REFERENCE TO RELATED APPLICATION(S) AND CLAIM OF PRIORITY

This application claims priority under 35 U.S.C. § 119(e) to U.S. Provisional Patent Application No. 63/057,118 filed on Jul. 27, 2020. The above-identified provisional patent application is hereby incorporated by reference in its entirety.

TECHNICAL FIELD

This disclosure relates generally to self-interference cancellation in radio antenna systems. Embodiments of this disclosure relate to self-interference cancellation to relieve isolation requirements of a duplexer in frequency division duplexing (FDD) systems.

BACKGROUND

In many parts of the world, significant portions of expansion in mobile wireless network capacity are due to expansions in the geographic coverage of wireless data networks. Technically and economically, this presents a set of challenges for keeping, as well as expanding, coverage in LTE and 5G cellular communication systems. Most of the LTE and 5G bands are at high frequencies, which have higher path loss and wider bandwidth than low frequency bands, and which have lower power spectrum density (PSD). Therefore, cell edge users typically have to be allocated with less than the full bandwidth of the available spectrum in order to boost the signal-to-noise ratio (SNR) at the base station (BS) for better reception.

Most of the frequency bands are allocated as frequency division duplex (FDD) bands, in which two separate frequency bands, or channels, are assigned for simultaneous (i.e., full duplex) downlink (DL) and uplink (UL) communications. Although FDD has the benefits of greater coverage due to accommodating higher transmission power, higher frequency resource efficiency with no guard time allocated, and potentially lower latency due to continuous transmission and reception, a sufficient guard band needs to separate the transmitting and receiving channels, so they do not interfere with one another and guarantee clear and uninterrupted transmission. Even though a large frequency separation band is assigned between the UL and DL bands, extremely high isolation is required between the UL and DL signal paths in FDD wireless communication devices to mitigate the interference between UL and DL bands.

SUMMARY

Embodiments of the present disclosure provide a method and an apparatus for self-interference cancellation in a communication device. In one embodiment, the communication device includes an antenna configured to transmit a transmit signal and receive a receive signal in full duplex communications, a first radio frequency (RF) analog to digital converter (RFADC) configured to convert the receive signal from analog to digital, a coupler configured to couple a sample of the transmit signal to a second RFADC, which is configured to convert the sample of the transmit signal from analog to digital, and self-interference cancellation circuitry configured to process the digital sample of the transmit signal to generate a self-interference cancellation signal and apply the self-interference cancellation signal to the digital receive signal to cancel an amount of interference induced in the receive signal by the transmit signal. The RFADC could be replaced by a conventional receive (RX) path comprising a low noise amplifier (LNA), down-converter, analog baseband filter and analog to digital converter (ADC).

In one embodiment, a method for self-interference cancellation includes generating, by transmit path circuitry, a transmit signal to be transmitted through an antenna in a transmit frequency band, and receiving, via the antenna, a receive signal in a receive frequency band. The method further includes converting, by a first RF analog to digital converter (RFADC) in a receive path circuitry, the receive signal from an analog receive signal to a digital receive signal, converting, by a second RFADC in a coupled path circuitry, a sample of the transmit signal from an analog sample of the transmit sample to a digital sample of the transmit signal, processing, by self-interference cancellation circuitry, the digital sample of the transmit signal to generate a self-interference cancellation signal, and applying, by the self-interference cancellation circuitry, the self-interference cancellation signal to the digital receive signal to cancel an amount of interference induced in the receive signal by the transmit signal. The RFADC could be replaced by a conventional RX path comprising an LNA, down-converter, analog baseband filter and analog to digital converter (ADC).

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

For a more complete understanding of the present disclosure and its advantages, reference is now made to the following description taken in conjunction with the accompanying drawings, in which like reference numerals represent like parts.

DETAILED DESCRIPTION

Figure 1:
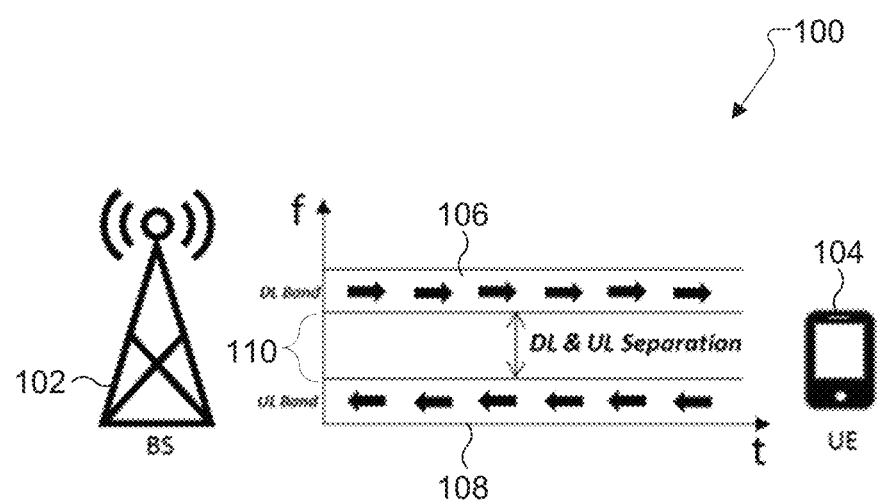
FIG. 1 illustrates an example wireless system, which transmits signals according to the principles of the present disclosure.

FIGS. 1 through 9D, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Embodiments of the present disclosure recognize that even though a large separation band (typically tens or even hundreds of MHz) is assigned between the UL and DL bands in an FDD system, there are two challenges for a FDD duplexer. First, transmitter (TX) leakage into the receiver (RX), due to power amplifier (PA) non-linearity that causes adjacent channel leakage, and due to antenna coupling. If the TX leakage in the RX band cannot be reduced to lower than the input referred RX noise floor at the RX chain input, the TX leakage will degrade the receiver sensitivity, which decreases the coverage.

Second, the TX noise floor is also much higher than the RX noise floor due to the high noise figure of the digital-to-analog converter (DAC) in the TX chain and the high gain of the TX chain from DAC output to PA output. If the TX noise coupled to the RX chain input is not lower than the RX input referred noise floor, it will also degrade the UL receiver sensitivity, which further decreases the coverage. The input referred RX input noise floor will be referred to as the RX noise floor.

Embodiments of the present disclosure recognize that, to address the above issues, a duplexer with isolation is implemented in FDD wireless communication devices to isolate the UL and DL bands. The TX leakage and TX noise floor can be decreased to lower than the RX noise floor by the high isolation in the duplexer, and the UL receiver's sensitivity is thereby guaranteed, and the duplexer is designed not to impact the TX power transmission except for introducing insertion loss. However, the isolation demands to achieve this goal can be extremely high. For example, in an FDD BS, more than 100 dB of isolation may be demanded of the duplexer due to the very large gap between the high transmission power for the DL TX band and the low sensitivity level for the UL RX band. As a result, the duplexer is of high cost and large form factor since more cavity taps are equipped to meet the extremely high isolation demand.

Accordingly, embodiments of the present disclosure provide an active self-interference cancellation (SIC) system in the digital domain to provide active SIC, achieving high system TX-RX isolation and large TX power handling with low-cost, small-form-factor duplexers. The SIC system provides effective TX-RX isolation, and the total system TX-RX isolation is calculated by summing the duplexer isolation and the digital domain isolation due to SIC processing. That is, the SIC system relieves the isolation burden on the duplexer, thereby allowing the use of smaller, less costly duplexers while achieving the same total TX-RX isolation as a larger, more costly duplexer. It is understood that relieving the isolation burden on a duplexer in an FDD wireless communication device is one application for the SIC system, and the SIC system could be used in other devices for different applications. One example could be to make the frequency response of the isolation provided by the duplexer reconfigurable by turning on SIC and returning to the baseline response by turning it off.

Embodiments of the present disclosure provide the active SIC system by sampling a TX signal at its input to a duplexer, equalizing the sampled TX signal with the RX signal, and subtracting the equalized TX signal from the RX signal to cancel effects of TX leakage and TX noise floor that are induced in the RX signal by the TX signal. Embodiments of the present disclosure implement the SIC process in the digital domain. Pre-processing can be performed on the sampled TX signal before input to the SIC process in order to reduce noise introduced to the sampled TX signal after it is sampled, and to filter the sampled TX signal to improve dynamic range of the sampled TX signal and to prevent nonlinearity and saturation effects during conversion from the analog domain to the digital domain.

Embodiments of the present disclosure also recognize that the disclosed SIC solution can be used in cross division duplex (XDD) systems as an alternative SIC solution. XDD enhances the UL coverage of TDD carriers without sacrificing DL data throughput. XDD allows the UE to transmit the uplink signal while the BS transmits the downlink signal at the same time, in the same spectrum within the same TDD band. That is, XDD allows full duplex communication similar to FDD, but within TDD bands. The UE's uplink can be scheduled with more opportunities in both time and frequency domain, therefore the coverage can be extended compared to the TDD systems.

Embodiments of the present disclosure use analog-to-digital converters (ADCs) and digital-to-analog converters (DACs). The terms ADC and DAC are sometimes synonymous with direct RF sampling ADC (RFADC) and direct RF sampling DAC (RFDAC), respectively. RFADCs and RFDACs do not require additional downconversion from RF or upconversion to RF. For example, an RFADC can digitize RF signal inputs, and downconversion to baseband is performed in the digital domain by the RFADC. Similarly, an RFDAC can receive baseband or intermediate frequency (IF) inputs, perform upconversion in the digital domain, and output analog RF signals.

FIG. 1 illustrates example wireless system 100, which transmits signals according to the principles of the present disclosure. In the illustrated embodiment, wireless system 100 includes a transmission point (e.g., an Evolved Node B (eNB), Node B), such as base station (BS) 102. BS 102 may be in communication with other base stations and with the Internet or a similar IP-based system (not shown).

BS 102 provides wireless broadband access to the Internet to a user equipment (UE) 104 (e.g., mobile phone, mobile station, or subscriber station) within a coverage area of BS 102. UE 104 may access voice, data, video, video conferencing, and/or other broadband services via the Internet. UE 104 may be associated with an access point (AP) of a WiFi WLAN. UE 104 may be any of a number of mobile devices, including a wireless-enabled laptop computer, wireless-enabled personal computer, personal data assistant, notebook, handheld device, or other wireless-enabled device. While only one base station and one user equipment are depicted in FIG. 1, it is understood that wireless system 100 may provide wireless broadband access to additional user equipment.

In this embodiment, wireless system 100 operates using frequency division duplexing (FDD), with two separate frequency bands, or channels, assigned for downlink (DL) and uplink (UL) communications. From the perspective of the BS 102, DL communications are transmitted signals, and UL communications are received signals. From the perspective of the UE 104, DL communications are received signals, and UL communications are transmitted signals. DL band 106 and UL band 108 are assigned with a guard band (GB) 110 between them to reduce interference between the DL band 106 and UL band 108 during operation. The guard band may be tens or hundreds of MHz. In spite of the guard band, there is still significant leakage of transmission power into the receive band, as transmission power at the point of transmission is significantly higher than reception power at the point of reception.

Figure 2:
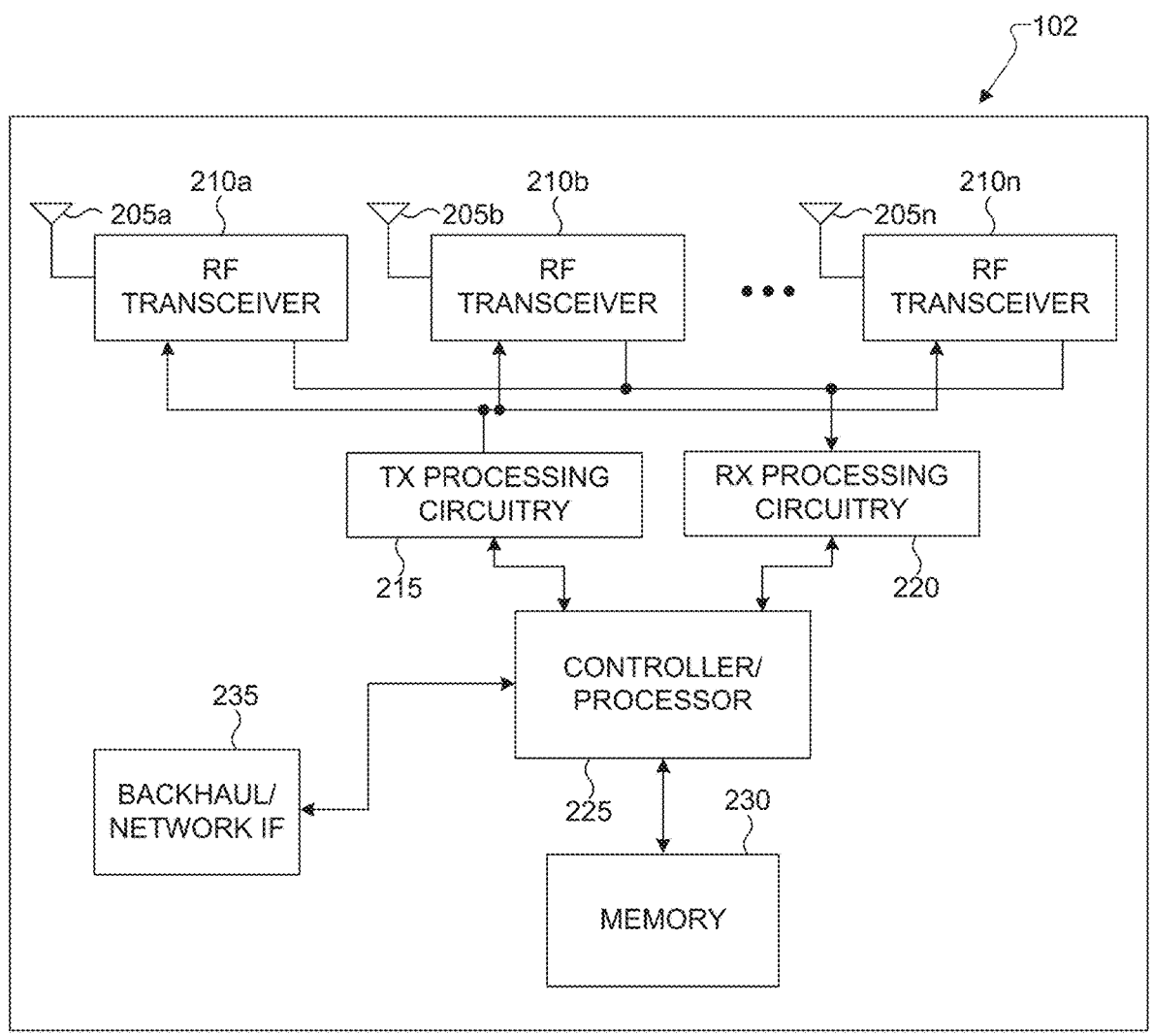
FIG. 2 illustrates an example base station (BS) according to embodiments of the present disclosure.

FIG. 2 illustrates an example BS 102 according to embodiments of the present disclosure. The embodiment of the BS 102 illustrated in FIG. 2 is for illustration only, and the BS 102 of FIG. 1 could have the same or similar configuration. However, BSs come in a wide variety of configurations, and FIG. 2 does not limit the scope of this disclosure to any particular implementation of a BS.

As shown in FIG. 2, the BS 102 includes multiple antennas 205a-205n, multiple RF transceivers 210a-210n, transmit (TX) processing circuitry 215, and receive (RX) processing circuitry 220. The BS 102 also includes a controller/processor 225, a memory 230, and a backhaul or network interface 235.

The RF transceivers 210a-210n receive, from the antennas 205a-205n, incoming RF signals, such as signals transmitted by UE 104 or other UEs in the system 100. The RF transceivers 210a-210n down-convert the incoming RF signals to generate IF or baseband signals. The IF or baseband signals are sent to the RX processing circuitry 220, which generates processed baseband signals by filtering, decoding, and/or digitizing the baseband or IF signals. The RX processing circuitry 220 transmits the processed baseband signals to the controller/processor 225 for further processing.

The TX processing circuitry 215 receives digital data (such as voice data, web data, e-mail, or interactive video game data) from the controller/processor 225. The TX processing circuitry 215 encodes, multiplexes, and/or digitizes the outgoing baseband data to generate processed baseband or IF signals. The RF transceivers 210a-210n receive the outgoing processed baseband or IF signals from the TX processing circuitry 215 and up-convert the baseband or IF signals to outgoing RF signals that are transmitted via the antennas 205a-205n.

The RF transceivers 210a-210n are FDD transceivers that each include a duplexer to facilitate simultaneous reception of the incoming RF signals and transmission of the outgoing RF signals. The duplexers also provide isolation between the incoming and outgoing RF signals. In some embodiments, the RF transceivers 210a-210n include active SIC processes that operate in the digital domain to further isolate the incoming RF signals from the outgoing RF signals, as will be further described below. In other embodiments, the RX processing circuitry 220 includes this active SIC process. The active SIC process can be implemented using dedicated digital domain hardware, such as an application-specific integrated circuit (ASIC) or a field-programmable gate array (FPGA). In some embodiments, the active SIC process is implemented in an RFIC. The active SIC process can also be implemented in the controller/processor 225.

The controller/processor 225 can include one or more processors or other processing devices that control the overall operation of the BS 102. For example, the controller/processor 225 could control the reception of forward channel signals and the transmission of reverse channel signals by the RF transceivers 210a-210n, the RX processing circuitry 220, and the TX processing circuitry 215 in accordance with well-known principles. The controller/processor 225 could support additional functions as well, such as more advanced wireless communication functions.

For instance, the controller/processor 225 could support beam forming or directional routing operations in which outgoing signals from multiple antennas 205a-205n are weighted differently to effectively steer the outgoing signals in a desired direction. Any of a wide variety of other functions could be supported in the BS 102 by the controller/processor 225.

The controller/processor 225 is also capable of executing programs and other processes resident in the memory 230, such as an operating system (OS). The controller/processor 225 can move data into or out of the memory 230 as required by an executing process.

The controller/processor 225 is also coupled to the backhaul or network interface 235. The backhaul or network interface 235 allows the BS 102 to communicate with other devices or systems over a backhaul connection or over a network. The interface 235 could support communications over any suitable wired or wireless connection(s). For example, when the BS 102 is implemented as part of a cellular communication system (such as one supporting 5G, LTE, or LTE-A), the interface 235 could allow the BS 102 to communicate with other BSs over a wired or wireless backhaul connection. When the BS 102 is implemented as an access point, the interface 235 could allow the BS 102 to communicate over a wired or wireless local area network or over a wired or wireless connection to a larger network (such as the Internet). The interface 235 includes any suitable structure supporting communications over a wired or wireless connection, such as an Ethernet or RF transceiver.

The memory 230 is coupled to the controller/processor 225. Part of the memory 230 could include a random access memory (RAM), and another part of the memory 230 could include a Flash memory or other read-only memory (ROM).

Although FIG. 2 illustrates one example of BS 102, various changes may be made to FIG. 2. For example, the BS 102 could include any number of each component shown in FIG. 2. As a particular example, an access point could include a number of interfaces 235, and the controller/processor 225 could support routing functions to route data between different network addresses. As another particular example, while shown as including a single instance of TX processing circuitry 215 and a single instance of RX processing circuitry 220, the BS 102 could include multiple instances of each (such as one per RF transceiver). Also, various components in FIG. 2 could be combined, further subdivided, or omitted and additional components could be added according to particular needs.

Figure 3:
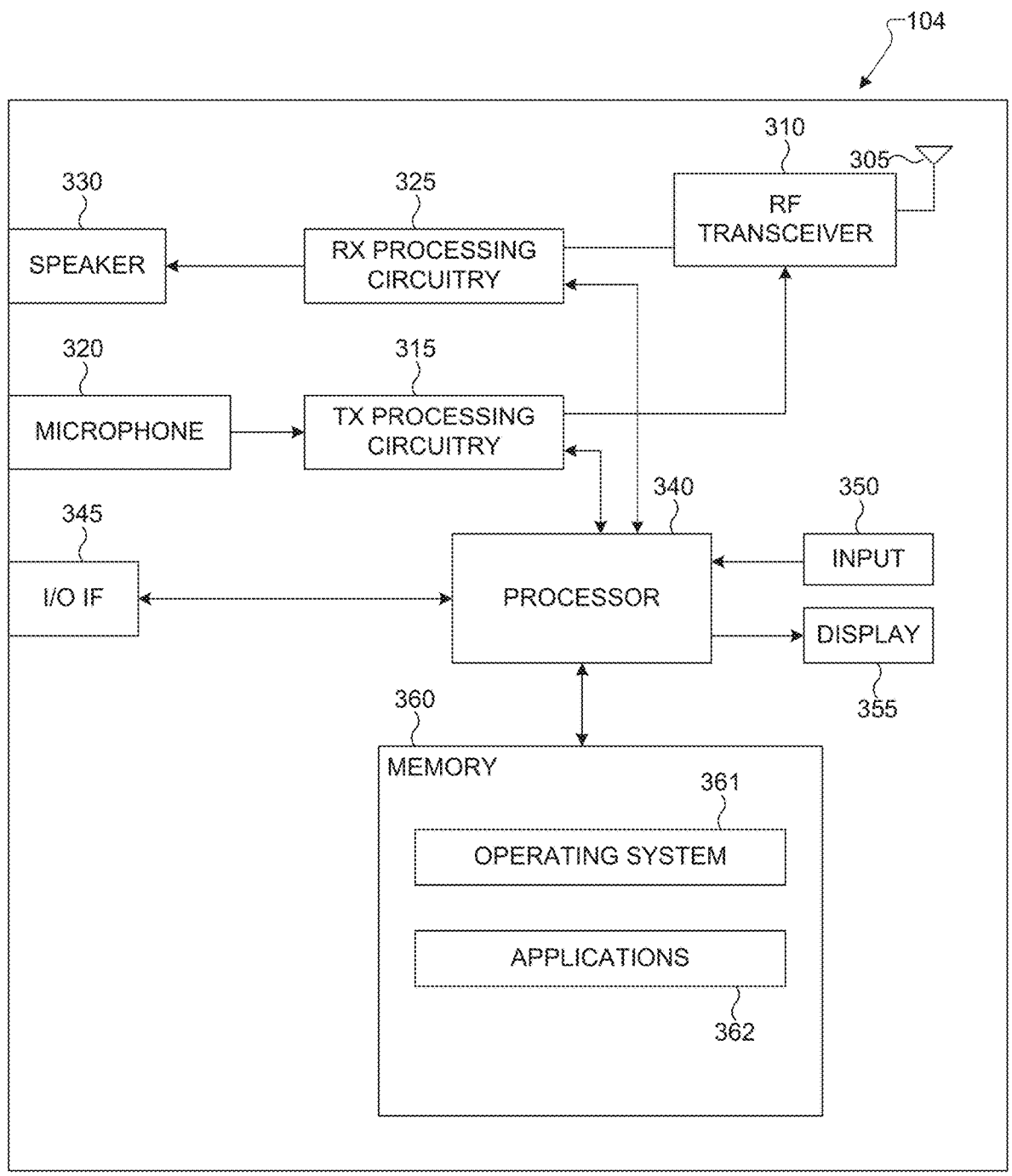
FIG. 3 illustrates an example user equipment (UE) according to embodiments of the present disclosure.

FIG. 3 illustrates an example UE 104 according to embodiments of the present disclosure. The embodiment of the UE 104 illustrated in FIG. 3 is for illustration only, and the UE 104 of FIG. 1 could have the same or similar configuration. UEs come in a wide variety of configurations, and FIG. 3 does not limit the scope of this disclosure to any particular implementation of a UE.

As shown in FIG. 3, the UE 104 includes an antenna 305, a radio frequency (RF) transceiver 310, TX processing circuitry 315, a microphone 320, and receive (RX) processing circuitry 325. The UE 104 also includes a speaker 330, a processor 340, an input/output interface (I/O IF) 345, a touchscreen 350, a display 355, and a memory 360. The memory 360 includes an OS 361 and one or more applications 362.

The RF transceiver 310 receives, from the antenna 305, an incoming RF signal transmitted by a BS, such as BS 102, of the system 100. The RF transceiver 310 down-converts the incoming RF signal to generate an intermediate frequency (IF) or baseband signal. The IF or baseband signal is sent to the RX processing circuitry 325, which generates a processed baseband signal by filtering, decoding, and/or digitizing the baseband or IF signal. The RX processing circuitry 325 transmits the processed baseband signal to the speaker 330 (such as for voice data) or to the processor 340 for further processing (such as for web browsing data).

The TX processing circuitry 315 receives analog or digital voice data from the microphone 320 or other outgoing baseband data (such as web data, e-mail, or interactive video game data) from the processor 340. The TX processing circuitry 315 encodes, multiplexes, and/or digitizes the outgoing baseband data to generate a processed baseband or IF signal. The RF transceiver 310 receives the outgoing processed baseband or IF signal from the TX processing circuitry 315 and up-converts the baseband or IF signal to an outgoing RF signal that is transmitted via the antenna 305.

The RF transceiver 310 is an FDD transceiver that includes a duplexer to facilitate simultaneous reception of the incoming RF signal and transmission of the outgoing RF signal. The duplexer also provides isolation between the incoming and outgoing RF signals. In some embodiments, the RF transceiver 310 includes an active SIC process that operates in the digital domain to further isolate the incoming RF signal from the outgoing RF signal, as will be further described below. In other embodiments, the RX processing circuitry 325 includes this active SIC process. The active SIC process can be implemented using dedicated digital domain hardware, such as an ASIC or an FPGA. In some embodiments, the active SIC process is implemented in an RFIC. The active SIC process can also be implemented in the processor 340.

The processor 340 can include one or more processors or other processing devices and execute the OS 361 stored in the memory 360 in order to control the overall operation of the UE 104. For example, the processor 340 could control the reception of forward channel signals and the transmission of reverse channel signals by the RF transceiver 310, the RX processing circuitry 325, and the TX processing circuitry 315 in accordance with well-known principles. In some embodiments, the processor 340 includes at least one microprocessor or microcontroller.

The processor 340 is also capable of executing other processes and programs resident in the memory 360, such as processes for CSI feedback on uplink channel. The processor 340 can move data into or out of the memory 360 as required by an executing process. In some embodiments, the processor 340 is configured to execute the applications 362 based on the OS 361 or in response to signals received from BSs or an operator. The processor 340 is also coupled to the I/O interface 345, which provides the UE 104 with the ability to connect to other devices, such as laptop computers and handheld computers. The I/O interface 345 is the communication path between these accessories and the processor 340.

The processor 340 is also coupled to the touchscreen 350 and the display 355. The operator of the UE 104 can use the touchscreen 350 to enter data into the UE 104. The display 355 may be a liquid crystal display, light emitting diode display, or other display capable of rendering text and/or at least limited graphics, such as from web sites.

The memory 360 is coupled to the processor 340. Part of the memory 360 could include a RAM, and another part of the memory 360 could include a Flash memory or other ROM.

Although FIG. 3 illustrates one example of UE 104, various changes may be made to FIG. 3. For example, various components in FIG. 3 could be combined, further subdivided, or omitted and additional components could be added according to particular needs. As a particular example, the processor 340 could be divided into multiple processors, such as one or more central processing units (CPUs) and one or more graphics processing units (GPUs). Also, while FIG. 3 illustrates the UE 104 configured as a mobile telephone or smartphone, UEs could be configured to operate as other types of mobile or stationary devices.

Figure 4:
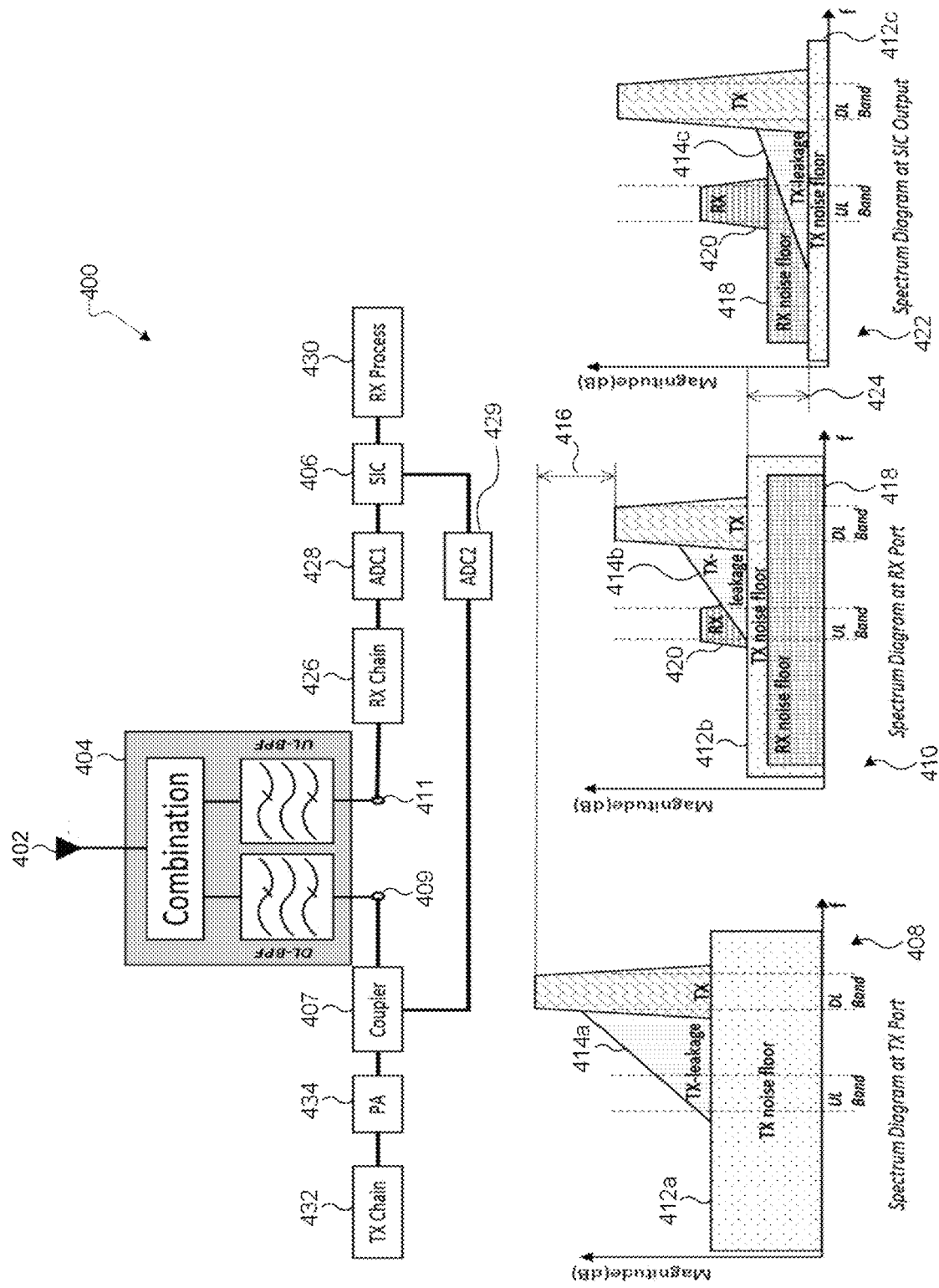
FIG. 4 illustrates a block diagram of an example FDD communication device according to embodiments of the present disclosure.

FIG. 4 illustrates a block diagram of an example FDD communication device 400 according to embodiments of the present disclosure. For convenience, the FDD communication device 400 is discussed below as being implemented in a FDD BS, however it is understood that the communication device 400 could be implemented in a FDD UE. In some embodiments, the FDD communication device 400 could be implemented in a BS 102 or UE 104 of FIGS. 1-3. It is understood that any number of communication devices 400 could be included in one BS 102 or UE 104. For example, an FDD BS or UE using a multiple-input multiple-output (MIMO) antenna array could include a communication device 400 for each antenna of the array.

The FDD communication device 400 includes an antenna 402, a duplexer 404, an SIC process 406, and a coupler 407. The antenna 402 is coupled to the duplexer 404. The duplexer 404 supports FDD communication, and facilitates frequency division duplex transmission and reception through antenna 402. The duplexer 404 accordingly has a TX port 409, which transmits the DL TX signal to radiation through antenna 402, and an RX port 411, which receives the UL RX signal through antenna 402. The duplexer 404 provides isolation between the DL TX frequency band and the UL RX frequency band. This isolation of the duplexer 404 reduces the TX leakage and TX noise floor induced in the UL RX frequency band in the TX circuits.

The coupler 407 couples a sample of the DL TX signal from the TX port 409 to the SIC process 406. In some embodiments, the sample of the DL TX signal can be less than 1% of the total power of the DL TX signal. The remaining power of the DL TX signal is passed to the TX port 409.

The SIC process 406 provides effective isolation between the DL TX frequency band and the UL RX frequency band, which is additive with the isolation provided by the duplexer 404 to provide the total TX-RX isolation of the FDD communication device 400. The SIC process 406 is implemented in the digital domain. Accordingly, the UL RX signal passes through the RX chain 426, which can include a first direct RF sampling analog-to-digital converter (RFADC) 428 (although the RFADC 428 is illustrated separate from the RX chain 426 here, for clarity) before input to the SIC process 406. This signal path, from the RX port 411 to the SIC process 406, is herein referred to as the main path, and the signal input to the SIC process 406 from the main path is herein referred to as the main path signal.

Additionally, because the SIC process 406 is implemented in the digital domain, the sample of the DL TX signal from the coupler 407 is passed through a second RFADC 429 before input to the SIC process 406. This signal path, from the TX port 409 through the coupler 407 to the SIC process 406, is herein referred to as the coupled path (or the coupling path), and the signal input to the SIC process 406 from the coupled path is herein referred to as the coupled path signal. In this embodiment, due to the use of direct RF sampling in the RFADCs 428 and 429, no additional downconversion is performed on the RX signal in the main path, or on the sample of the DL TX signal in the coupled path, to lower the frequency range of the DL RX signal before input to the RFADCs 428 and 429, respectively.

In some embodiments, the SIC process equalizes the coupled path signal to the main path signal, and then subtracts the equalized signal from the main path signal. As a result, since the coupled path only contains a TX-related signal, including TX leakage and TX noise floor in the UL RX frequency band, the output of the SIC process 406 is an SIC residual with the unmodified UL RX signal. The SIC residual corresponds to the spectrum diagram 422, and the TX leakage and TX noise floor are canceled out to a level that is lower than the RX noise floor.

One embodiment of this process is explained as minimization of the error between the coupled signal x[n] passing through an equalizer h and the received signal, y[n] in the UL band, where n is the time index. This can be done as a calibration in the factory to compute the filter:

$$\hat{h} = \arg\min_h \|h*x[n] - y[n]\| \quad (1)$$

The FIR equalizer is calculated as:

$$h*x[n] = \begin{bmatrix} x[0] & 0 & 0 \\ x[1] & x[0] & 0 \\ x[2] & x[1] & x[0] \end{bmatrix} \begin{bmatrix} h_0 \\ h_1 \\ h_2 \end{bmatrix} = Xh \quad (2)$$

using the least squares (LS) solution:

$$h = (X^T X + \Delta I)^{-1} X^T y \quad (3)$$

where $\Delta$ is a regularization factor proposed by Tikhonov (See Tikhonov, A. et al., *Nonlinear Ill-posed problems*, London: Chapman & Hall, ISBN 0412786605, August 2018) which is chosen to improve the numerical stability of the LS problem.

In some embodiments, the requirement of the amount of isolation provided by the duplexer 404 can be determined based on input constraints of the SIC process 406, and the SIC process 406 can be parameterized to provide additional effective isolation that is sufficient to reduce TX leakage and the TX noise floor in the UL RX band below the RX noise floor. This ensures that the quality of the UL RX signal is sufficient for RX processing by RX process 430. Spectrum diagrams 408, 410, and 422 demonstrate such an embodiment.

Spectrum diagram 408 illustrates the frequency spectrum at TX port 409, and spectrum diagram 410 illustrates the frequency spectrum at RX port 411. TX noise floor 412a and the TX leakage 414a at the TX port 409 are a result of the effects of processing of the DL TX signal in the TX chain 432, which can include PA 434 (although PA 434 is illustrated separately from TX chain 432 here, for clarity). Comparing the TX noise floor 412a and the TX leakage 414a at the TX port 409 to the TX noise floor 412b and the TX leakage 414b at the RX port 411, the magnitude of the TX leakage and the TX noise floor are reduced at RX port 411 by a first amount that corresponds to the duplexer isolation 416 provided by the duplexer 404. At this point, the TX noise floor 412b and the TX leakage 414b are still above the RX noise floor 418, and would degrade the recovery of UL RX signal 420 if it were sent to RX processing 430.

Spectrum diagram 422 illustrates the frequency spectrum at the output of the SIC process 406. Comparing the TX noise floor 412b and the TX leakage 414b at the RX port 411 to the TX noise floor 412c and the TX leakage 414c at the output of the SIC process 406, the magnitude of the TX leakage and the TX noise floor are reduced by a second amount at the output of the SIC process 406. This second amount corresponds to the effective SIC isolation 424 provided by the SIC process 406. Comparing TX noise floor 412c and the TX leakage 414c at the output of the SIC process 406 to the original TX noise floor 412a and TX leakage 414a in spectrum diagram 408, it is seen the total TX-RX isolation provided by the duplexer 404 and the SIC process 406 is the sum of the duplexer isolation 416 and the effective SIC isolation 424. This result is comparable to the result that could be achieved with a larger, more costly duplexer having an isolation equivalent to the sum of the duplexer isolation 416 and the effective SIC isolation 424.

Although FIG. 4 illustrates one example of FDD communication device 400, various changes may be made to FIG. 4. For example, various components in FIG. 4 could be combined, further subdivided, or omitted and additional components could be added according to particular needs.

Figure 5:
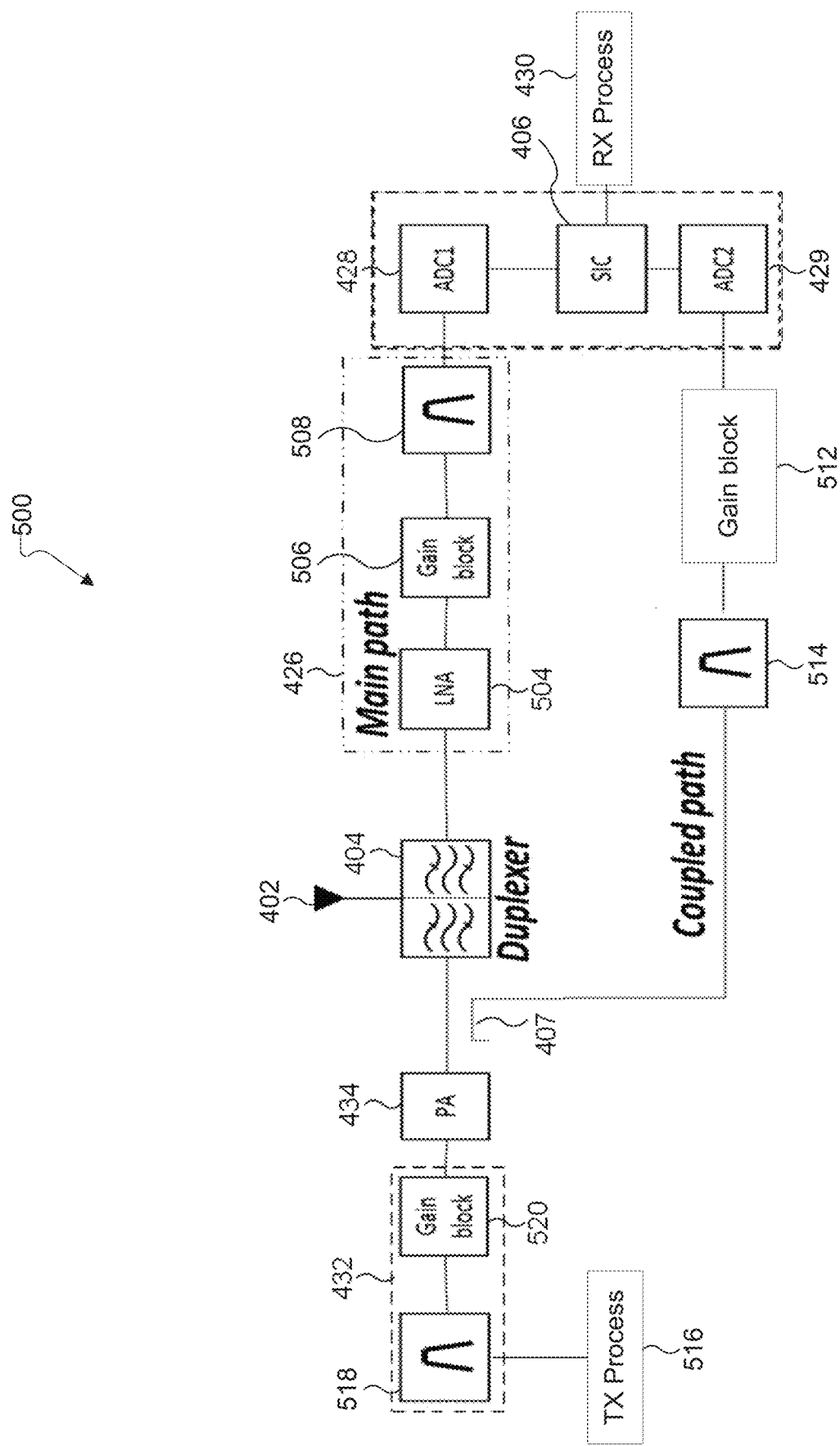
FIG. 5 illustrates a block diagram of an example FDD communication device according to embodiments of the present disclosure.

FIG. 5 illustrates a block diagram of an example FDD communication device 500 according to embodiments of the present disclosure. FDD communication device 500 is an embodiment of the FDD communication device 400 of FIG. 4. In this embodiment, FDD communication device 500 operates using direct RF sampling ADCs for RFADCs 428 and 429. That is, no additional downconversion is performed on the RX signal in the main path, or on the sample of the DL TX signal in the coupled path, to lower the frequency range of the DL RX signal before input to the RFADCs 428 and 429, respectively.

In the main path, RX chain 426 includes a low noise amplifier (LNA) 504 and a gain block 506. A UL bandpass filter (BPF) 508 may optionally be included in the design. If the circuit includes a UL BPF 508, it filters out frequencies outside of the UL RX frequency band, and has a steep transition response in order to select only the UL RX frequency band from the UL RX signal. This improves the dynamic range of the UL RX signal, without distorting the UL RX signal, for input to the first RFADC 428. This is quite beneficial to boost the SNR of the coupled signal.

The coupler 407 couples a sample of the DL TX signal into the coupled path as the coupled path signal. The DL TX signal is output by the PA 434 after being generated by a TX process 516 and the TX chain 432. In this embodiment, the TX chain 432 includes an image rejection (IR) filter 518 that filters out from the DL TX signal the image spectrum in the Nyquist zones other than the interested one. The output of the IR filter 518 is passed through a gain block 520 that functions as a pre-driver before input to the PA 434.

In some embodiments, the coupled path has its own noise floor, which is independent from the TX noise floor and from the RX noise floor in the main path. Due to this independence, when the coupled path signal is equalized with the main path signal in the SIC process 406, the coupled path noise floor component will not be affected, and the attempt to subtract the equalized coupled path signal from the main path signal will result in adding the coupled path noise floor to the RX noise floor in the main path. The coupled path is designed to minimize the coupled path noise floor during the equalization based cancellation.

To further increase the SNR of the coupled path signal, the power level of the coupled path signal can be amplified to obtain a very high signal power in the target UL RX frequency band before input to the second RFADC 429. A gain block 512 is included in the coupled path to perform this amplification. However, as the dominant power component in the coupled path signal is the DL TX signal component in the DL TX frequency band, amplifying the coupled path signal such that the signal power in the target UL RX frequency band is high will result in even higher signal power in the DL TX frequency band, which could generate a nonlinearity product or saturate the second RFADC 429.

To solve this problem, the sample of the DL TX signal from coupler 407 is input to a DL bandstop filter (BSF) 514, also known as a band reject filter. The DL BSF 514 filters out frequencies in the DL TX frequency band from the sample of the DL TX signal before amplification by the gain block 512. This also improves the dynamic range of the DL TX signal for input to the second RFADC 429.

At this point, the coupled path signal input to the SIC process 406 from the second RFADC 429 and the main path signal input to the SIC process 406 from the first RFADC 428 are dominated by signal components in the target UL RX frequency band. Accordingly, the SIC process 406 is performed only on the target UL RX frequency band rather than on the entire frequency band of the system. The output of the SIC process 406 is the SIC residual which is provided to RX process 430 for further RX processing.

Although FIG. 5 illustrates one example of FDD communication device 500, various changes may be made to FIG. 5. For example, various components in FIG. 5 could be combined, further subdivided, or omitted and additional components could be added according to particular needs.

Figure 6A:
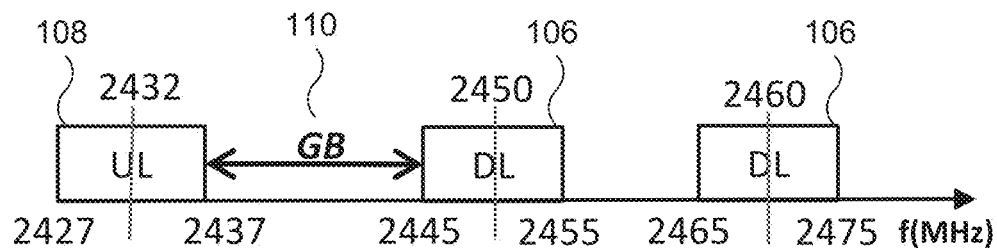
FIG. 6A illustrates an example set of frequency bands allocated for communication in an FDD system according to embodiments of the present disclosure.

FIG. 6A illustrates an example set of frequency bands allocated for communication in an FDD system according to embodiments of the present disclosure, such as the wireless system 100 of FIG. 1. In this example, the system has a 10 MHz UL band 108 centered around 2432 MHz, and two 10 MHz DL bands 106 centered around 2450 MHz and 2460 MHz, respectively. An 8 MHz guard band 110 is allocated between the UL band 108 and the nearest DL band 106.

It is understood that FIG. 6A is an example, and other frequency bands could be used with embodiments of the present disclosure. For example, in LTE systems, a number of FDD band configurations are allocated by the 3rd Generation Partnership Project (3GPP). These configurations include Band 1, having a UL band of 1920-1980 MHz paired with a DL band of 2110-2170 MHz and a guard band of 190 MHz, Band 2, having a UL band of 1850-1910 MHz paired with a DL band of 1930-1990 MHz and a guard band of 80 MHz, Band 3, having a UL band of 1710-1785 MHz paired with a DL band of 1805-1880 MHz and a guard band of 95 MHz, and Band 4, having a UL band of 1710-1755 MHz paired with a DL band of 2110-2155 MHz and a guard band of 400 MHz.

Figure 6B:
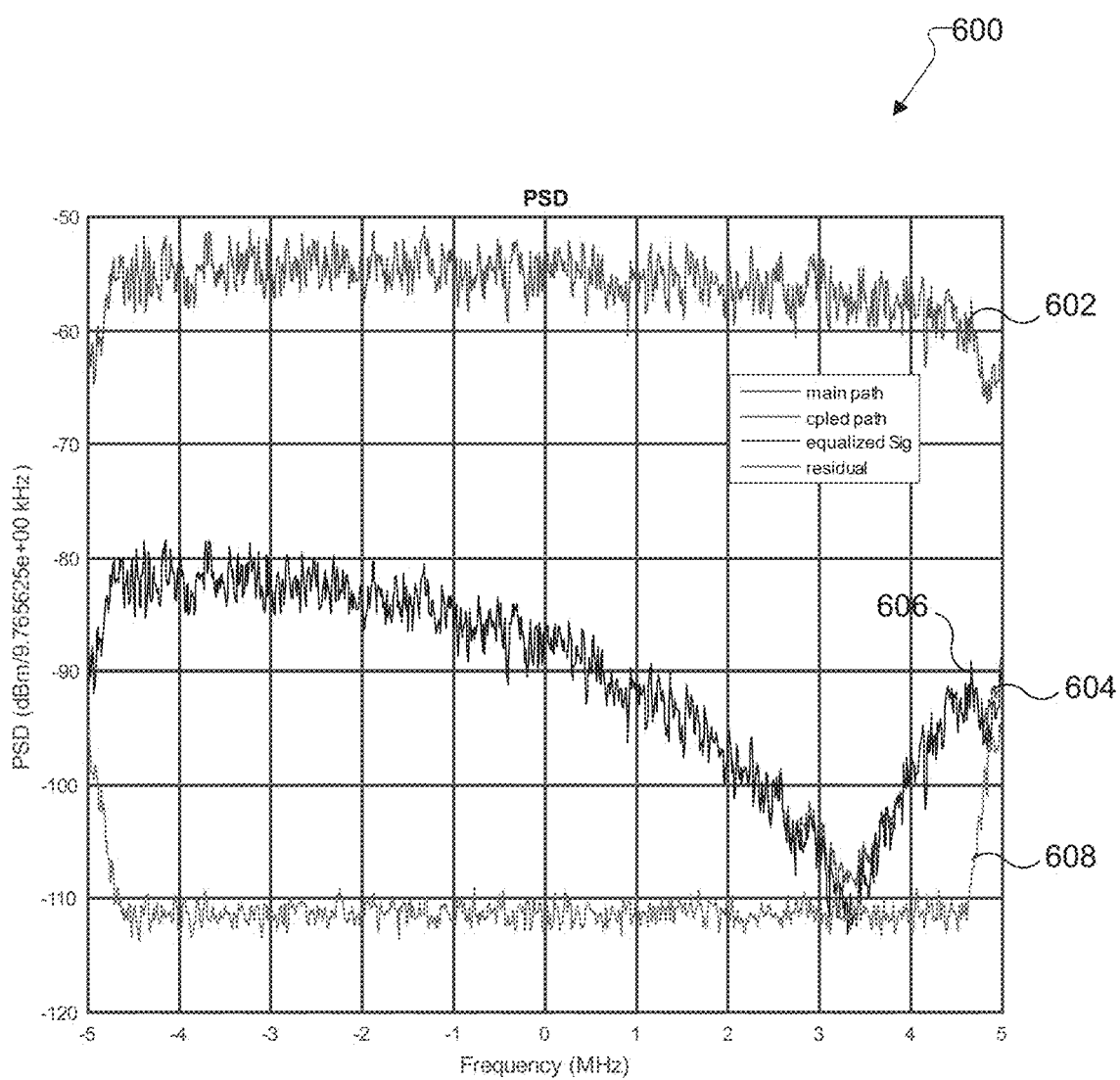
FIG. 6B illustrates a power spectral density (PSD) graph for the self-interference cancellation (SIC) process according to embodiments of the present disclosure.

FIG. 6B illustrates a power spectral density (PSD) graph 600 for the SIC process according to embodiments of the present disclosure. For example, the PSD graph 600 could represent the PSD of signals related to the SIC process 406, discussed above with respect to FIGS. 4-5. In this embodiment, the PSD graph 600 represents the PSD of signals generated based on the example set of frequency bands of FIG. 6A. It is understood that the PSD graph 600 is merely an example, and the PSD of signals in the FDD communication devices 400 or 500 could vary significantly.

PSD graph 600 includes the coupled path signal PSD 602 at the input to the SIC process 406, the main path signal PSD 604 at the input to the SIC process 406, the equalized signal PSD 606 generated by the SIC process 406, and the SIC residual PSD 608 output by the SIC process 406. In an embodiment corresponding to the embodiment of FIG. 5, SIC processing is performed only on the target UL RX frequency band. Accordingly, frequency components outside of the UL RX frequency band are filtered out and are not shown in FIG. 6B.

The coupled path signal PSD 602 is the PSD of the digitized coupled path signal at the output of the second RFADC 429, and includes the PSD of the TX leakage and TX noise floor within the UL RX frequency band, which is related to the TX leakage and TX noise floor induced within the UL RX frequency band in the main path signal. The main path signal PSD 604 is the PSD of the digitized main path signal at the output of the first RFADC 428, and includes the TX leakage and TX noise floor induced in the main path signal by the DL TX signal. For illustration of the SIC process, no UL RX signal is present in this example.

The equalized signal PSD 606 represents the result of equalizing the coupled path signal to the main path signal by the SIC process 406. The equalized signal PSD 606 nearly identically matches the main path signal PSD 604. That is, the equalized signal PSD 606 nearly identically matches the PSD of the interference induced by the TX leakage and the TX noise floor in the UL RX band.

As described above, the equalized signal is subtracted from the main path signal. The PSD of the result of this subtraction is the SIC residual PSD 608. In this example, the RX noise floor is −111.5 dBm/10 kHz, meaning that the SIC residual PSD 608 is simply the RX noise floor PSD, and the effects of the TX leakage and TX noise floor have been canceled out to a scale much less than the RX noise floor.

The effective TX-RX isolation provided by the SIC process 406 in the example of FIGS. 6A and 6B is 28 dB. Accordingly, the isolation requirement of the duplexer in this system is reduced by 28 dB. For example, if the TX-RX isolation requirement for the system is 86 dB, a duplexer with 58 dB can be combined with the SIC process 406 to achieve a total TX-RX isolation of 86 dB. The reduction in isolation requirement of the duplexer from 86 dB to 58 dB results in cost and hardware size savings for the system.

Although FIGS. 6A and 6B illustrate one an example set of frequency bands allocated for communication in an FDD system and one example PSD graph for the SIC process, various changes may be made to FIGS. 6A and 6B. For example, different frequency bands could be allocated, and different signals could be used as the transmit signal.

Figure 7:
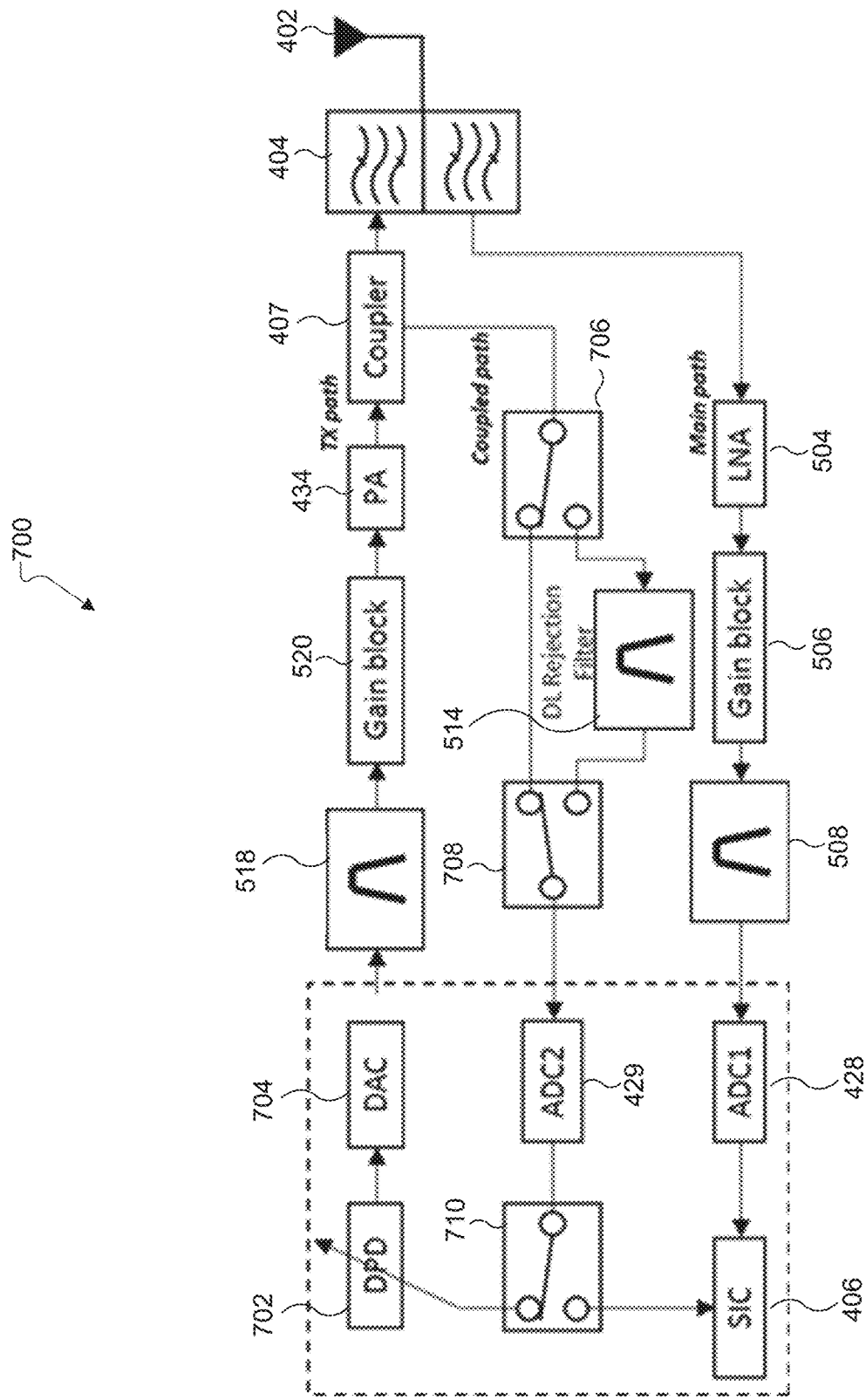
FIG. 7 illustrates a block diagram of an example FDD communication device according to embodiments of the present disclosure.

FIG. 7 illustrates a block diagram of an example FDD communication device 700 according to embodiments of the present disclosure. FDD communication device 700 is an embodiment of the FDD communication device 400 of FIG. 4. In particular, FDD communication device 700 is a modification of FDD communication device 500 of FIG. 5. In this embodiment, FDD communication device 700 operates using direct RF sampling ADCs for RFADCs 428 and 429. That is, no downconversion is performed on the DL RX signal in the main path, or on the sample of the DL TX signal in the coupled path, to lower the frequency range of the DL RX signal before input to the RFADCs 428 and 429, respectively.

FDD communication device 700 shares many elements in common with FDD communication device 500. FDD communication device 700 additionally includes digital predistorter (DPD) 702 and a DAC 704, which are part of the TX chain. The DPD 702 uses feedback from the TX path of the FDD communication device 700, similar to the SIC process 406, however the DPD 702 does not use the same preprocessing as the SIC process 406. In particular, the DPD 702 operates on the DL TX signal itself, so filtering the coupled path signal to reject the DL TX band would be problematic. Accordingly, the FDD communication device 700 shares the coupled path between the SIC process 406 and the DPD 702, and uses switches 706, 708, and 710 to alter the coupled path as needed, depending on whether the SIC process 406 or the DPD 702 is in use.

When the SIC process 406 is in use, switches 706 and 708 route the coupled path through the preprocessing hardware used for the SIC process 406. In this embodiment, only DL rejection filter 514 is used for preprocessing. In other embodiments gain block 512 could be contained in this segment of the coupled path as well. Furthermore, switch 710 routes the output of the second RFADC 429 into the SIC process 406.

When the DPD 702 is in use, switches 706 and 708 bypass the preprocessing hardware used for the SIC process 406 (e.g., the DL rejection filter 514), instead feeding the sample of the DL TX signal directly into the second RFADC 429. Switch 710 then routes the output of the second RFADC 429 into the DPD 702.

As the DPD 702 and the SIC process 406 do not operate simultaneously, they are able to share the second RFADC 429 to digitize the feedback signal for both processes. FDD communication device 700 thereby allows for cost savings and size reduction of the FDD communication device.

Although FIG. 7 illustrates one example of FDD communication device 700, various changes may be made to FIG. 7. For example, various components in FIG. 7 could be combined, further subdivided, or omitted and additional components could be added according to particular needs.

Figure 8:
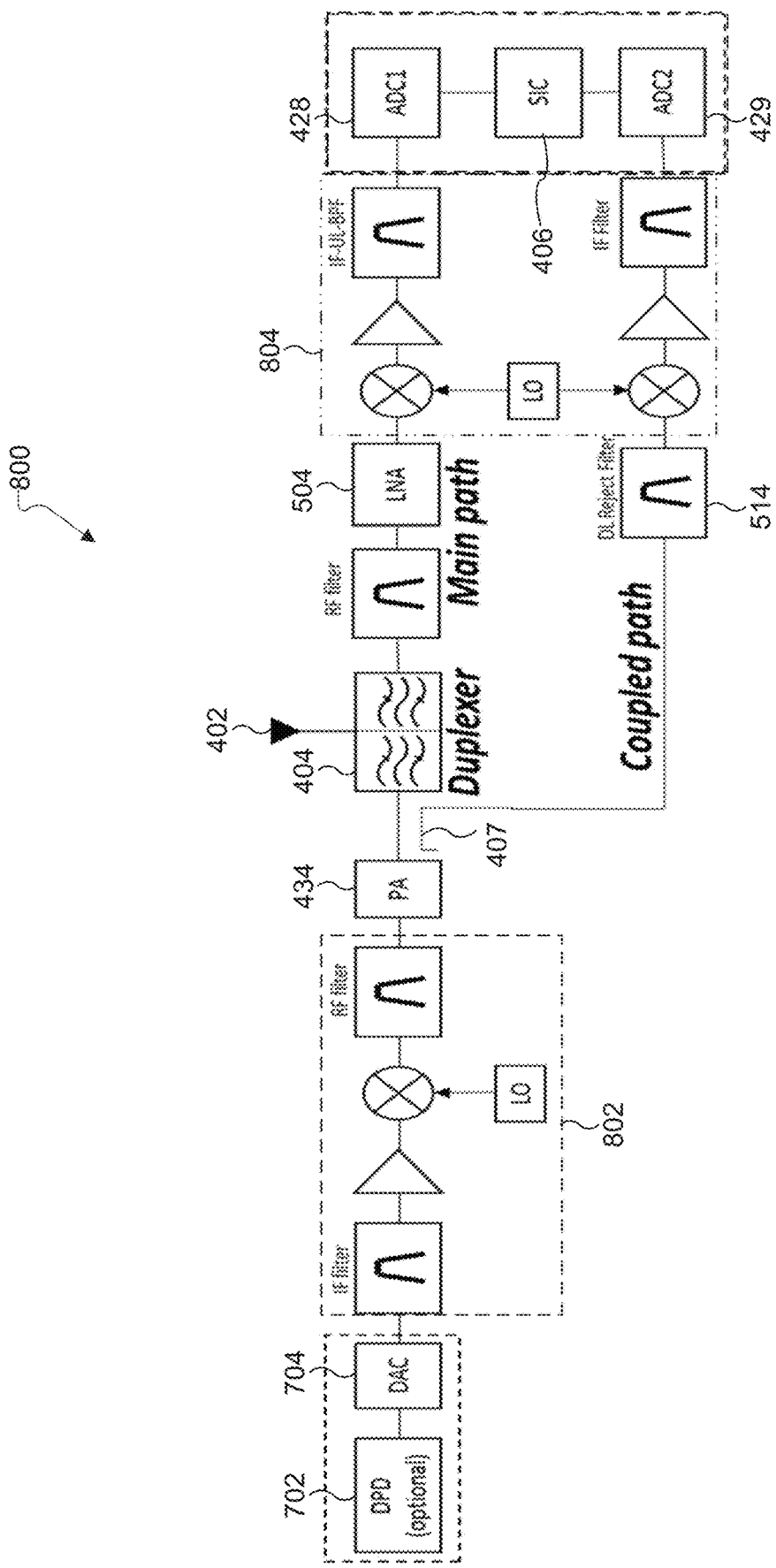
FIG. 8 illustrates a block diagram of an example FDD communication device according to embodiments of the present disclosure.

FIG. 8 illustrates a block diagram of an example FDD communication device 800 according to embodiments of the present disclosure. FDD communication device 800 is an embodiment of the FDD communication device 400 of FIG. 4 or FDD communication device 500 of FIG. 5. In this embodiment, FDD communication device 800 uses an IF sampling transceiver. That is, downconversion is performed on the DL RX signal in the main path and in the coupled path before input to the ADCs 428 and 429, respectively. Superheterodyne and IF sampling transceivers are commonly deployed in implementations of FDD base stations. As illustrated in the embodiment of FIG. 8, the SIC process 406 can be implemented in these types of conventional transceivers as well.

FDD communication device 800 includes the SIC process 406 and the coupled path components of FDD communication device 400, as well as a DL rejection filter 514 in the coupled path, as disclosed above with respect to FDD communication device 500 of FIG. 5. However, the ADCs 428 and 429 are IF or baseband ADCs, and the DAC 704 is an IF or baseband DAC. Accordingly, FDD communication device 800 also includes IF to RF upconversion components 802 and RF to IF downconversion components 804.

The TX side signal from the DAC 704 is upconverted using the IF to RF upconversion components 802 before it is amplified by the PA 434 to generate the DL TX signal. The coupled path sample of the DL TX signal and the main path UL RX signal on the RX side go through independent downconverters in the RF to IF downconversion components 804, and through independent analog IF filters, before input to the ADCs 428 and 429, respectively. In this embodiment, the mixer in the coupled path of the downconversion components 804 is driven by the local oscillator (LO) that is used by the RX main path. In other embodiments, the mixer in the coupled path of the downconversion components 804 could be driven by the LO that in the upconversion components 802 (which is used by the TX path) instead of the LO from the RX main path.

Aside from this, the SIC process 406 operates as described above. Moreover, it is understood that a the SIC process 406 could similarly be implemented into a baseband FDD transceiver. For example, the FDD communication device 800 could be modified to perform RF to baseband downconversion and baseband to RF upconversion.

Although FIG. 8 illustrates one example of FDD communication device 800, various changes may be made to FIG. 8. For example, various components in FIG. 8 could be combined, further subdivided, or omitted and additional components could be added according to particular needs.

FIGS. 9A-9D illustrate embodiments of a process for self-interference cancellation in accordance with various embodiments of the present disclosure. For example, the process depicted in FIGS. 9A-9D may be performed by the BS 102 or the UE 104 of FIG. 1-3. For convenience, the process will be discussed from the point of view of an FDD BS. Various embodiments of the process depicted in FIG. 9A may be implemented using the FDD communication devices 400, 500, 700, and 800 of FIGS. 4, 5, 7, and 8, respectively.

The process begins by generating, by a transmit path circuitry, a transmit signal to be transmitted through an antenna in a transmit frequency band (step 905). For example, in step 905, a DL TX signal is generated for transmission in an FDD TX band by an antenna of the FDD BS. The DL TX signal is provided to a duplexer in the transmit path circuitry, and the duplexer provides a first amount of isolation between the DL TX band and the UL RX band, as discussed above.

Next, the process receives, via the antenna, a receive signal in a receive frequency band (step 910). For example, in step 910, a UL RX signal is received in an FDD UL band by the FDD BS antenna. In some embodiments, the UL RX signal is received simultaneously with the transmission of the DL TX signal in step 905 (i.e., in full duplex communication where duplexer isolation is substituted by separating TX and RX antennas and providing isolation between the two antennas). This can cause TX leakage and TX noise floor from the DL TX signal to be induced in the UL RX band, as discussed above. In order to reduce the effect of the TX leakage and TX noise floor, the UL RX signal is provided from the antenna through a duplexer before the process continues to step 915. The duplexer provides the first amount of isolation between the DL TX band and the UL RX band, as discussed above.

The process then rejects, using a bandpass filter, frequencies outside of the receive frequency band from the receive signal (step 915). For example, in step 915, a UL BPF can filter out frequencies outside of the UL RX frequency band from the UL RX signal. This can improve the dynamic range and SNR of the UL RX signal, without distorting the UL RX signal, for input to a first ADC below at step 920.

The process next converts, using a first ADC in a receive path circuitry, the receive signal from an analog receive signal to a digital receive signal (step 920). In this embodiment, the first ADC is an RFADC, and no downconversion of the analog receive signal is necessary before input to the first ADC. The digital receive signal is later combined with the output of SIC cancellation circuitry at step 945.

Steps 925 and 930 occur in embodiments of the process that are implemented on a communication device such as FDD communication device 500 of FIG. 5. In these embodiments, the process then rejects, using a band rejection filter in a coupled path circuitry, frequencies in the transmit frequency band from a sample of the transmit signal, thereby generating a filtered sample of the transmit signal (step 925). The sample of the transmit signal can be, for example, a signal that is sampled from the DL TX signal using a coupler, which can direct a small amount of power (e.g., less than 1% of the total DL TX signal power) into the coupled path circuitry. In step 925, the band rejection filter is a DL BSF that filters out frequencies in the DL TX band in order to largely remove the DL TX signal components from the sampled DL TX signal before amplification at step 930. This also improves dynamic range of the sample of the DL TX signal before input to the second ADC below at step 935.

In the embodiments that correspond to FIG. 5, the process next amplifies, using an amplifier in the coupled path circuitry, the filtered sample of the transmit signal (step 930). This amplifies the TX leakage and TX noise floor components in the UL RX band to reduce the effect of noise in the coupled path circuitry. This, in turn, improves the SNR of the TX leakage and TX noise floor components in the UL RX band for use in the self-interference cancellation process below at step 940.

The process then converts, by a second ADC in the coupled path circuitry, the sample of the transmit signal from an analog sample of the transmit signal to a digital sample of the transmit signal (step 935). In this embodiment, the second ADC is an RFADC, and no downconversion of the analog receive signal is necessary before input to the second ADC. In embodiments involving steps 925 and 930, the sample of the transmit signal is the filtered sample of the transmit signal, and a digital filtered sample of the transmit signal is generated at step 935. In embodiments that do not include steps 925 and 930, the sample of the transmit signal is coupled directly from the TX path to the second ADC.

Next, the digital sample of the transmit signal is processed by SIC circuitry to generate an SIC signal (step 940), and the SIC circuitry applies the SIC signal to the digital receive signal to cancel an amount of interference induced in the receive signal by the transmit signal (step 945). For example, in step 945, the SIC signal is subtracted from the digital UL RX signal, which cancels an amount of the TX leakage and TX noise floor interference from the UL RX signal in the UL RX band. The output of the process is the SIC residual, which can be made available for further RX processing in the FDD BS.

Figure 9A:
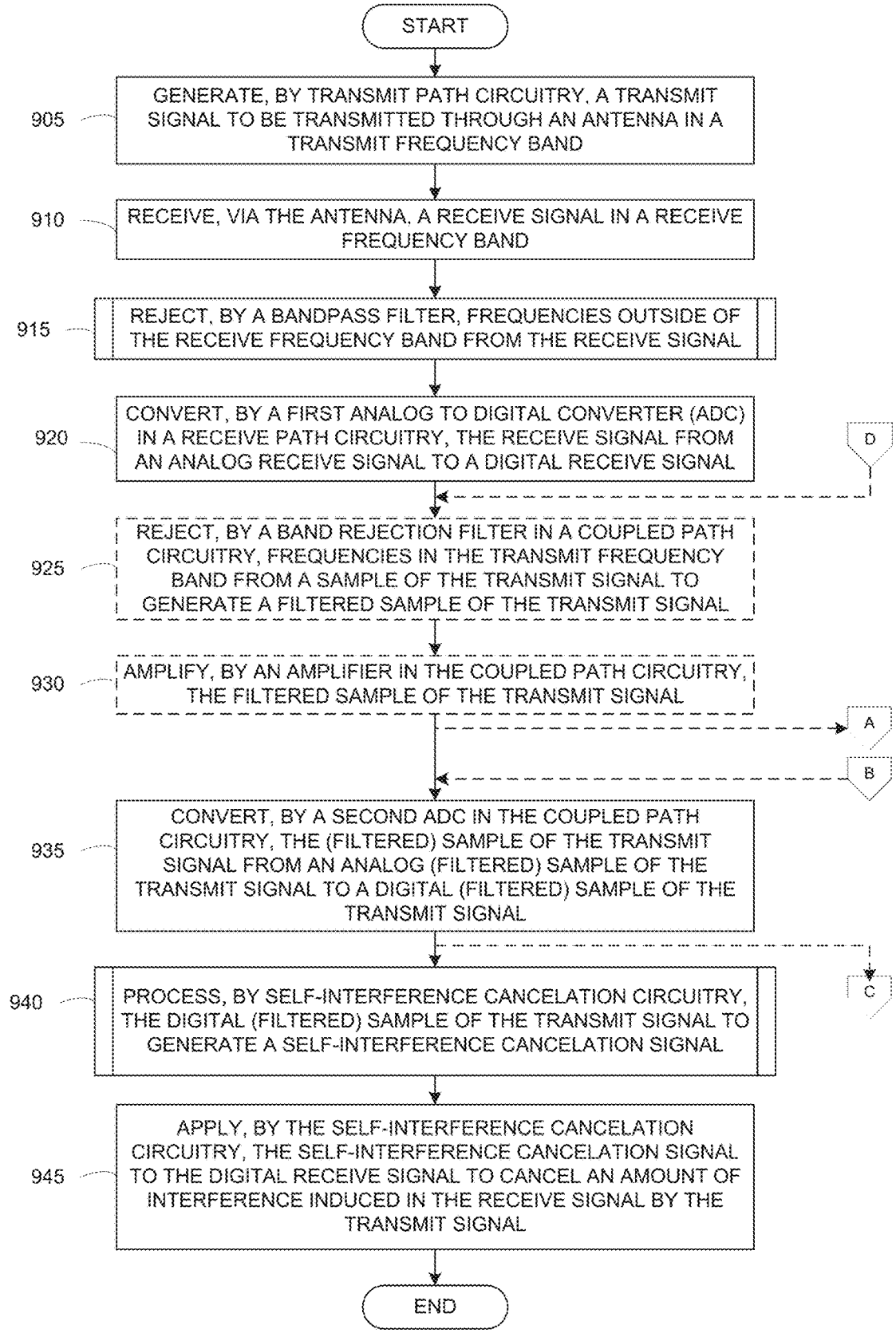
FIGS. 9A-9D illustrate embodiments of a process for self-interference cancellation in accordance with various embodiments of the present disclosure.
Figure 9B:
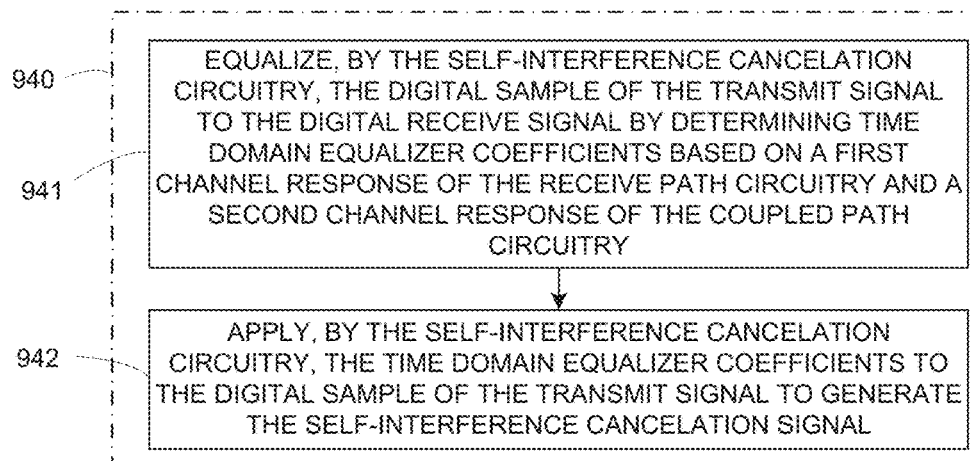

FIG. 9B illustrates further details of an embodiment of the SIC processing of step 940. In this embodiment, the digital sample of the transmit signal is equalized to the digital receive signal by the SIC circuitry (step 941). For example, step 941 includes determining time domain equalizer coefficients based on a first channel response of the receive path circuitry and a second channel response of the coupled path circuitry. Next, the SIC circuitry applies the time domain equalizer coefficients to the digital sample of the transmit signal to generate the SIC signal (step 942). It is understood that this is one embodiment of SIC processing, and other types of SIC processing could be used.

Figure 9C:
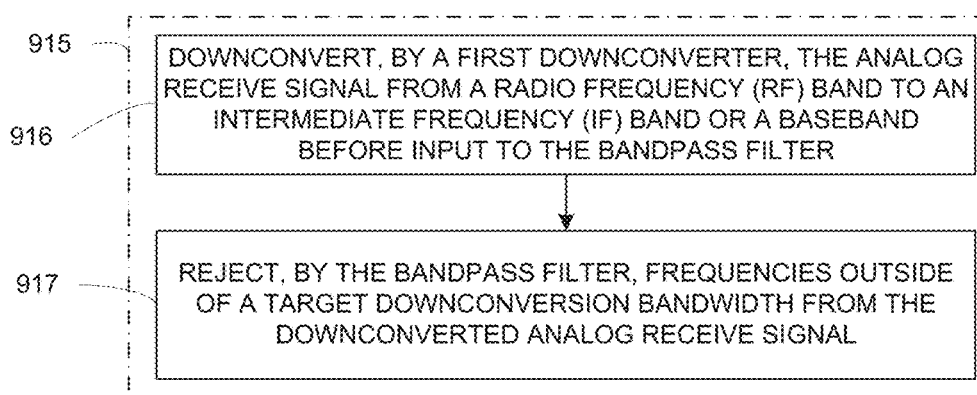
Figure 9C:
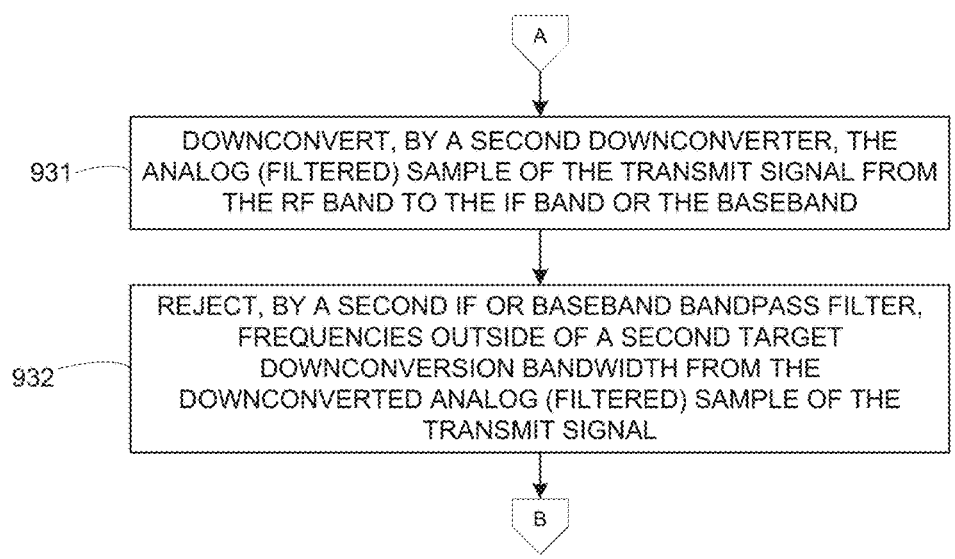

FIG. 9C illustrates further details of an embodiment of the process of FIG. 9A that is implemented using FDD communication device 800 of FIG. 8. The FDD communication device 800 includes an IF sampling transceiver, and accordingly the process of FIG. 9C includes steps related to IF processing. Unless otherwise noted, the process of FIG. 9C follows the steps of the process of FIG. 9A.

In place of step 915 of FIG. 9A, steps 916 and 917 are performed in the process of FIG. 9C. At step 916, the process downconverts, using a first downconverter, the analog receive signal from an RF band to an IF band or baseband before input to the bandpass filter. The BPF is an IF or baseband BPF.

At step 917, the IF or baseband BPF rejects frequencies outside of a target downconversion bandwidth from the downconverted analog receive signal. For example, steps 916 and 917 prepare the analog UL RX signal for input to the first ADC at step 920 of FIG. 9A. In this embodiment, the first ADC is an IF or baseband ADC.

Steps 931 and 932 of the process of FIG. 9C are performed after step 930 and before step 935 of FIG. 9A (as indicated by markers A and B in FIG. 9A). As the FDD communication device 800 can be implemented based on either the FDD communication device 400 of FIG. 4 or the FDD communication device 500 of FIG. 5, the process of FIG. 9C can be implemented with or without the DL TX band reject filtering and subsequent amplification of steps 925 and 930 of FIG. 9A.

The process downconverts, using a second downconverter, the analog sample of the transmit signal from the RF band to the IF band or the baseband (step 931). The process then rejects, using a second IF or baseband BPF, frequencies outside of a second target downconversion bandwidth from the downconverted analog sample of the transmit signal (step 932). For example, steps 931 and 932 prepare the sample of the DL TX signal for input to the second ADC at step 935 of FIG. 9A. In this embodiment, the second ADC is an IF or baseband ADC.

Figure 9D:
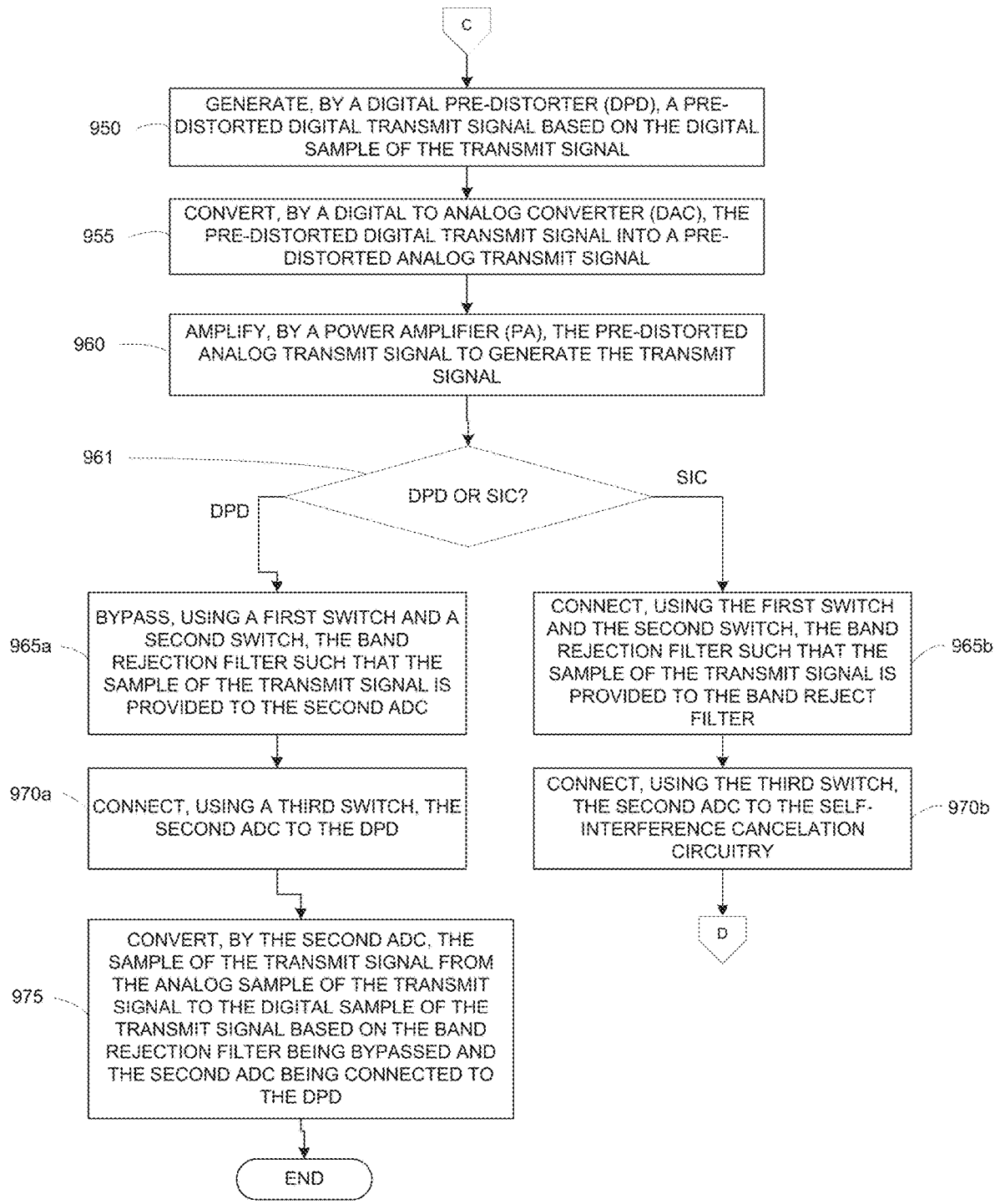

FIG. 9D illustrates further details of an embodiment of the process of FIG. 9A that is implemented using FDD communication device 700 of FIG. 7. The FDD communication device 700 includes a digital pre-distorter (DPD) that shares the coupled path and the second ADC with the SIC process in order to obtain feedback from the DL TX signal. Accordingly, the process of FIG. 9D includes steps related to switching the coupling path connection between the SIC process and the DPD. Unless otherwise noted, the process of FIG. 9D follows the steps of the process of FIG. 9A.

The process of FIG. 9D begins after step 935 of FIG. 9A, as indicated by marker C in FIG. 9A. The process receives a digital sample of the transmit signal from the second ADC, without the filtering or amplification of steps 925 and 930. For example, as described below in steps 965-975, the band rejection filter of step 925 is present in the communication device, but is bypassed to obtain this digital sample of the transmit signal.

The process generates, using the DPD, a pre-distorted digital transmit signal based on the digital sample of the transmit signal (step 950). For example, the DPD is part of the TX chain of the FDD BS and receives a digital DL TX signal from the TX processing portion of the FDD BS for pre-distortion. In step 950 the DPD uses the digital sample of the transmit signal as feedback in the generation of a pre-distorted digital DL TX signal based on the digital DL TX signal. This pre-distortion prepares the signal for input to the power amplifier (PA) at step 960.

The process then converts, using a DAC, the pre-distorted digital transmit signal into a pre-distorted analog transmit signal (step 955). Next, the process amplifies, using a PA, the pre-distorted analog transmit signal to generate the transmit signal (step 960). For example, in step 960 the pre-distorted digital DL TX signal is amplified by the PA to generate the final DL TX signal that will be input to the duplexer of the FDD BS. This step is analogous to step 905 of FIG. 9A.

At decision block 961, the process determines whether the coupling path circuitry is to be used to route a sample of the transmit signal to the DPD or to the SIC circuitry. If the sample of the DL TX signal is to be used for the SIC process, then the process continues at step 965*b*, discussed below. If the sample of the DL TX signal is to be used for feedback to the DPD, then the process continues to step 965*a*.

When it is determined at decision block 961 that the sample of the DL TX signal is to be used for feedback to the DPD, the process bypasses, using first and second switches, the band rejection filter such that a sample of the transmit signal is provided to the second ADC directly (step 965*a*). For example, in step 965*a* a sample of the DL TX signal is to be used as feedback for the DPD in step 950. In order to operate properly, the DPD input should not have the band rejection filtering used by the SIC circuitry applied.

The process next connects, using a third switch, the second ADC to the DPD (step 970*a*). The process also converts, using the second ADC, the sample of the transmit signal from the analog sample of the transmit signal to the digital sample of the transmit signal (step 975). The digital sample of the DL TX signal is then able to be used as feedback by the DPD, as discussed with respect to step 950.

When it is determined at decision block 961 that the sample of the DL TX signal is to be used by the SIC circuitry, the process connects, using the first and second switches, the band rejection filter in the coupling path, such that the sample of the transmit signal is provided to the band reject filter, and the output of the band reject filter is provided to the second ADC (step 965*b*). The process then connects, using the third switch, the second ADC to the SIC circuitry (step 970*b*).

The process then continues to step 925 of FIG. 9A, as indicated by marker D in FIG. 9A. In this way, the process of FIG. 9D is able to adjust the coupled path to provide the necessary signals to perform either the SIC process included in FIG. 9A or the digital pre-distortion of FIG. 9D, as needed.

The above flowcharts illustrate example methods that can be implemented in accordance with the principles of the present disclosure and various changes could be made to the methods illustrated in the flowcharts herein. For example, while shown as a series of steps, various steps in each figure could overlap, occur in parallel, occur in a different order, or occur multiple times. In another example, steps may be omitted or replaced by other steps.

Although the present disclosure has been described with an exemplary embodiment, various changes and modifications may be suggested to one skilled in the art. It is intended that the present disclosure encompass such changes and modifications as fall within the scope of the appended claims. None of the description in this application should be read as implying that any particular element, step, or function is an essential element that must be included in the claims scope. The scope of patented subject matter is defined by the claims.

What is claimed is:

1. A communication device comprising:
   an antenna configured to receive a receive signal in a receive frequency band and transmit a transmit signal in a transmit frequency band;
   transmit path circuitry configured to generate the transmit signal, the transmit path circuitry comprising a digital pre-distorter (DPD), a digital to analog converter (DAC), and a power amplifier (PA);
   receive path circuitry configured to process the receive signal, the receive path circuitry including a first analog to digital converter (ADC) configured to convert the receive signal from an analog receive signal to a digital receive signal;
   coupled path circuitry comprising a coupler, a band rejection filter, a second ADC, a first switch, a second switch, and a third switch; and
   self-interference cancellation circuitry,
   wherein the coupler is configured to couple a sample of the transmit signal to the first switch, the first switch is configured to connect the coupler switchably to an input of the band rejection filter and the second switch, the second switch is configured to connect an input of the second ADC switchably to the first switch and an output of the band rejection filter, the third switch is configured to connect an output of the second ADC switchably to the self-interference cancellation circuitry and the DPD, the band rejection filter is configured to reject frequencies in the transmit frequency band from the sample of the transmit signal to generate a filtered sample of the transmit signal, the second ADC is configured to convert the filtered sample of the transmit signal from an analog sample of the transmit signal to a digital sample of the transmit signal based on the second ADC being connected to the output of the band rejection filter and to the self-interference cancellation circuitry, and the second ADC is further configured to convert the sample of the transmit signal from an analog sample of the transmit signal to the digital sample of the transmit signal based on being connected to the first switch and to the DPD, wherein the self-interference cancellation circuitry is configured to:
process the digital sample of the transmit signal that is output by the second ADC by equalizing the digital sample of the transmit signal to the digital receive signal to generate a self-interference cancellation signal; and
apply the self-interference cancellation signal to the digital receive signal that is output by the first ADC to cancel an amount of interference induced in the receive signal by the transmit signal, and
wherein the DPD is configured to generate a pre-distorted digital transmit signal based on the digital sample of the transmit signal, the DAC is configured to convert the pre-distorted digital transmit signal into a pre-distorted analog transmit signal, and the PA is configured to amplify the pre-distorted analog transmit signal to generate the transmit signal.

2. The communication device of claim 1, wherein the self-interference cancellation circuitry is configured to equalize the digital sample of the transmit signal to the digital receive signal by determining time domain equalizer coefficients based on a first channel response of the receive path circuitry and a second channel response of the coupled path circuitry, and applying the time domain equalizer coefficients to the digital sample of the transmit signal to generate the self-interference cancellation signal.

3. The communication device of claim 1, further comprising a duplexer operably connected to the antenna and configured to provide isolation between the receive frequency band and the transmit frequency band to reduce a first amount of the interference induced in the receive signal by the transmit signal, the duplexer further configured to receive the transmit signal from the transmit path circuitry and to output the receive signal to the receive path circuitry.

4. The communication device of claim 3, wherein:
the duplexer is operably connected to the transmit path circuitry and the receive path circuitry, the duplexer further configured to reduce a total amount of power going into the receive path circuitry to guarantee that the receive path circuitry is working in a linear range of the receive path circuitry, and
applying the self-interference cancellation signal to the digital receive signal cancels the interference induced in the receive signal to a noise floor in case that a nonlinearity component generated in the receive path circuitry is less than the noise floor.

5. The communication device of claim 1, wherein the receive path circuitry further comprises a bandpass filter configured to reject frequencies outside of the receive frequency band from the analog receive signal before input to the first ADC.

6. The communication device of claim 5, wherein:
based on the receive path circuitry being equipped with intermediate frequency (IF) sampling receiver architecture, the receive path circuitry further comprises a first downconverter configured to downconvert the analog receive signal from a radio frequency (RF) band to an IF band or a baseband before input to the bandpass filter,
the bandpass filter is an IF or baseband bandpass filter configured to reject frequencies outside of a target downconversion bandwidth from the downconverted analog receive signal, and
the coupled path circuitry further comprises a second downconverter and a second IF or baseband bandpass filter, the second downconverter configured to downconvert the analog sample of the transmit signal from the RF band to the IF band or the baseband, the second IF or baseband bandpass filter configured to reject frequencies outside of a second target downconversion bandwidth from the downconverted analog sample of the transmit signal before input to the second ADC.

7. The communication device of claim 1, wherein the coupled path circuitry further includes an amplifier configured to amplify the filtered sample of the transmit signal before input to the second ADC.

8. A method of self-interference cancellation in a communication device, comprising:
generating, by transmit path circuitry, a transmit signal to be transmitted through an antenna in a transmit frequency band;
receiving, via the antenna, a receive signal in a receive frequency band;
converting, by a first analog to digital converter (ADC) in a receive path circuitry, the receive signal from an analog receive signal to a digital receive signal;
connecting, using a first switch, a band rejection filter in a coupled path circuitry to the transmit path circuitry, connecting, using a second switch, the band rejection filter to a second ADC in the coupled path circuitry, connecting, using a third switch, the second ADC to a self- interference cancellation circuitry, rejecting, by the band rejection filter, frequencies in the transmit frequency band from a sample of the transmit signal to generate a filtered sample of the transmit signal, and converting, by the second ADC, the filtered sample of the transmit signal from an analog sample of the transmit signal to a digital sample of the transmit signal based on the second ADC being connected to the band rejection filter and the self-interference cancellation circuitry;
processing, by the self-interference cancellation circuitry, the digital sample of the transmit signal by equalizing the digital sample of the transmit signal to the digital receive signal to generate a self-interference cancellation signal; and
applying, by the self-interference cancellation circuitry, the self-interference cancellation signal to the digital receive signal to cancel an amount of interference induced in the receive signal by the transmit signal,
wherein the method further comprises:
generating, by a digital pre-distorter (DPD), a pre-distorted digital transmit signal based on the digital sample of the transmit signal;

converting, by a digital to analog converter (DAC), the pre-distorted digital transmit signal into a pre-distorted analog transmit signal;

amplifying, by a power amplifier (PA), the pre-distorted analog transmit signal to generate the transmit signal; and bypassing, using the first switch and the second switch, the band rejection filter such that the sample of the transmit signal is provided to the second ADC, connecting, using the third switch, the second ADC to the DPD, and converting, by the second ADC, the sample of the transmit signal from an analog sample of the transmit signal to the digital sample of the transmit signal based on the band rejection filter being bypassed and the second ADC being connected to the DPD.

9. The method of claim 8, further comprising:

equalizing, by the self-interference cancellation circuitry, the digital sample of the transmit signal to the digital receive signal by determining time domain equalizer coefficients based on a first channel response of the receive path circuitry and a second channel response of the coupled path circuitry; and applying by the self-interference cancellation circuitry, the time domain equalizer coefficients to the digital sample of the transmit signal to generate the self-interference cancellation signal.

10. The method of claim 8, further comprising:

providing, by a duplexer operably connected to the antenna, isolation between the receive frequency band and the transmit frequency band to reduce a second amount of the interference induced in the receive signal by the transmit signal;

receiving, by the duplexer, the transmit signal from the transmit path circuitry; and outputting, by the duplexer, the receive signal to the receive path circuitry.

11. The method of claim 10, wherein the duplexer is operably connected to the transmit path circuitry and the receive path circuitry, the method further comprising reducing, by the duplexer, a total amount of power going into the receive path circuitry to guarantee that the receive path circuitry is working in a linear range of the receive path circuitry, and wherein applying the self-interference cancellation signal to the digital receive signal cancels the interference induced in the receive signal to a noise floor in case that a nonlinearity component generated in the receive path circuitry is less than the noise floor.

12. The method of claim 8, further comprising rejecting, by a bandpass filter, frequencies outside of the receive frequency band from the analog receive signal before input to the first ADC.

13. The method of claim 12, further comprising:

based on the receive path circuitry being equipped with intermediate frequency (IF) sampling receiver architecture, downconverting, by a first downconverter, the analog receive signal from a radio frequency (RF) band to an IF band or a baseband before input to the bandpass filter;

rejecting, by the bandpass filter, frequencies outside of a target downconversion bandwidth from the downconverted analog receive signal, wherein the bandpass filter is an IF or baseband bandpass filter;

downconverting, by a second downconverter, the analog sample of the transmit signal from the RF band to the IF band or the baseband; and rejecting, by a second IF or baseband bandpass filter, frequencies outside of a second target downconversion bandwidth from the downconverted analog sample of the transmit signal before input to the second ADC.

14. The method of claim 8, further comprising amplifying, by an amplifier, the filtered sample of the transmit signal before the converting.

* * * * *